(12) United States Patent
Kato et al.

(10) Patent No.: US 11,905,595 B2
(45) Date of Patent: Feb. 20, 2024

(54) FILM DEPOSITION APPARATUS AND FILM DEPOSITION METHOD

(71) Applicant: Tokyo Electron Limited, Tokyo (JP)

(72) Inventors: Hitoshi Kato, Iwate (JP); Toru Ishii, Iwate (JP); Yuji Seshimo, Yamanashi (JP); Yuichiro Sase, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 167 days.

(21) Appl. No.: 17/163,889

(22) Filed: Feb. 1, 2021

(65) Prior Publication Data
US 2021/0246550 A1  Aug. 12, 2021

(30) Foreign Application Priority Data
Feb. 6, 2020 (JP) ................. 2020-018838

(51) Int. Cl.
| C23C 16/46 | (2006.01) |
| C23C 16/455 | (2006.01) |
| C23C 16/458 | (2006.01) |
| C23C 16/52 | (2006.01) |

(52) U.S. Cl.
CPC .... *C23C 16/45544* (2013.01); *C23C 16/4584* (2013.01); *C23C 16/45536* (2013.01); *C23C 16/463* (2013.01); *C23C 16/52* (2013.01)

(58) Field of Classification Search
CPC ........ C23C 16/45551; C23C 16/45544; C23C 16/4586; C23C 16/463
See application file for complete search history.

(56) References Cited

U.S. PATENT DOCUMENTS

| 5,134,965 A * | 8/1992 | Tokuda | H01J 37/32192 204/298.31 |
| 2002/0073924 A1* | 6/2002 | Chiang | C23C 16/0227 257/E21.171 |
| 2003/0194493 A1* | 10/2003 | Chang | C23C 16/45519 156/345.31 |
| 2008/0026162 A1* | 1/2008 | Dickey | C23C 16/45551 427/595 |
| 2015/0340255 A1* | 11/2015 | Parkhe | H01L 21/67248 165/80.5 |
| 2017/0191159 A1* | 7/2017 | Polyak | C23C 16/463 |
| 2017/0298514 A1* | 10/2017 | Hirano | H01J 37/32238 |
| 2019/0127849 A1* | 5/2019 | Hane | C23C 16/45536 |

FOREIGN PATENT DOCUMENTS

| JP | 2011-054742 | 3/2011 |
| JP | 2014-022653 | 2/2014 |
| JP | 2018-026528 | 2/2018 |

* cited by examiner

*Primary Examiner* — Joseph A Miller, Jr.
(74) *Attorney, Agent, or Firm* — IPUSA, PLLC

(57) ABSTRACT

A film deposition apparatus includes a rotary table disposed in a vacuum chamber; multiple stages on each of which a substrate is placeable, the stages being arranged along a circumferential direction of the rotary table; a process area configured to supply a process gas toward an upper surface of the rotary table; a heat treatment area that is disposed apart from the process area in the circumferential direction of the rotary table and configured to heat-treat the substrate at a temperature higher than a temperature used in the process area; and a cooling area that is disposed apart from the heat treatment area in the circumferential direction of the rotary table and configured to cool the substrate.

11 Claims, 8 Drawing Sheets

FILM DEPOSITION APPARATUS AND FILM DEPOSITION METHOD

CROSS-REFERENCE TO RELATED APPLICATION

The present application is based upon and claims priority to Japanese Patent Application No. 2020-018838, filed on Feb. 6, 2020, the entire contents of which are incorporated herein by reference.

BACKGROUND OF THE INVENTION

1. Field of the Invention

Ar aspect of this disclosure relates to a film deposition apparatus and a film deposition method.

2. Description of the Related Art

Japanese Unexamined Patent Application Publication No. 2018-026528, for example, discloses a film deposition apparatus including a process chamber that is divided into four process areas by separation parts arranged at regular intervals in the circumferential direction of the process chamber. In the film deposition apparatus, a material gas is supplied to two process areas, and a reaction gas is supplied to the remaining two process areas.

SUMMARY OF THE INVENTION

In an aspect of this disclosure, there is provided a film deposition apparatus including a rotary table disposed in a vacuum chamber; multiple stages on each of which a substrate is placeable, the stages being arranged along a circumferential direction of the rotary table; a process area configured to supply a process gas toward an upper surface of the rotary table; a heat treatment area that is disposed apart from the process area in the circumferential direction of the rotary table and configured to heat-treat the substrate at a temperature higher than a temperature used in the process area; and a cooling area that is disposed apart from the heat treatment area in the circumferential direction of the rotary table and configured to cool the substrate.

DESCRIPTION OF THE PREFERRED EMBODIMENTS

Ar aspect of this disclosure provides a technology that makes it possible to form a high-quality semiconductor film.

Embodiments of the present invention are described below with reference to the accompanying drawings. Throughout the drawings, the same or corresponding reference number is assigned to the same or corresponding component, and repeated descriptions of the same or corresponding component are omitted.

<Film Deposition Apparatus>

Figure 1:
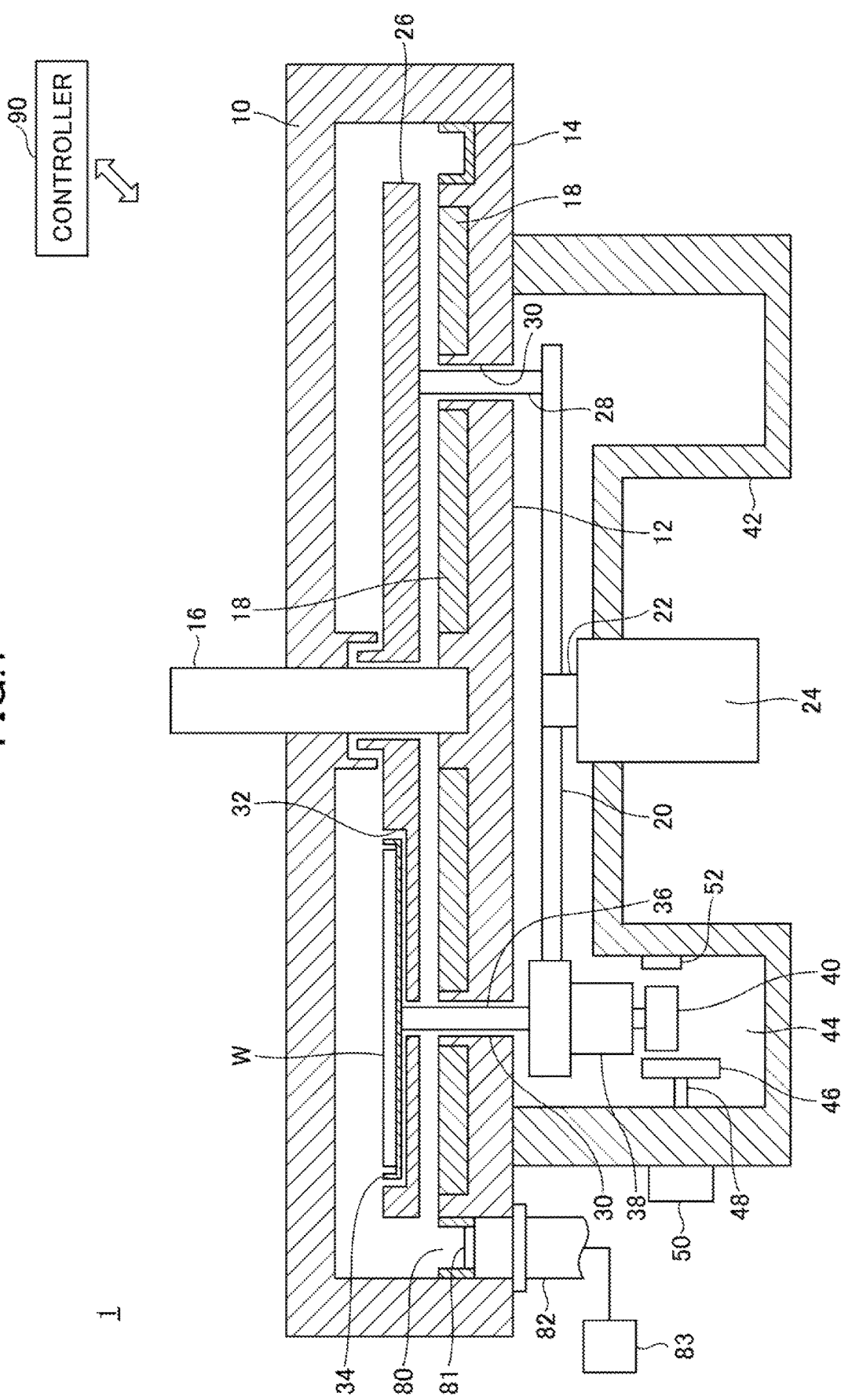
FIG. 1 is a vertical cross-sectional view illustrating an example of a configuration of a film deposition apparatus according to an embodiment.

Ar example of a configuration of a film deposition apparatus is described with reference to FIGS. 1 through 5. FIG. 1 is a vertical cross-sectional view illustrating an example of a configuration of a film deposition apparatus 1 according to an embodiment.

The film deposition apparatus 1 includes a flat vacuum chamber 10. The bottom of the vacuum chamber 10 is divided in the radial direction into a central part 12 and an annular part 14 surrounding the central part 12. The central part 12 is supported by a support part 16. The support part 16 passes through the central portion of the ceiling of the vacuum chamber 10 and is inserted into the vacuum chamber 10 from above. The annular part 14 is fixed to the side wall of the vacuum chamber 10.

Heaters 18 for heating a substrate W are provided on the upper surfaces of the central part 12 and the annular part 14. For example, each of the heaters 18 is formed by placing a heating wire in a quartz container. The heating wire is connected to a power source (not shown) and generates heat when power is supplied from the power source.

A rotating support 20 is provided below the vacuum chamber 10. The rotating support 20 is horizontally rotated by a rotation shaft 22 provided at a position corresponding to the center of the vacuum chamber 10. The rotation shaft 22 is rotated by a drive unit (not shown) housed in a case 24.

A rotary table 26 is provided in the vacuum chamber 10. The rotary table 26 is supported by the rotating support 20 via rod-shaped supports 28. The supports 28 pass through an annular gap 30 between the central part 12 and the annular part 14 constituting the bottom of the vacuum chamber 10 and are arranged in the circumferential direction.

Four circular recesses 32 are formed in the upper surface of the rotary table 26 and arranged at regular intervals in the circumferential direction. A stage 34 on which the substrate W is placeable is provided in each recess 32 and supported by a rotation shaft 36. The stage 34 is configured such that the upper surface of the substrate W placed on the stage 34 is at the same height as the upper surface of the rotary table 26. In FIG. 1, the right side of the rotary table 26 corresponds to an area where the stage 34 is not provided, and the left side of the rotary table 26 corresponds to an area where the stage 34 is provided.

Each rotation shaft 36 passes through the annular gap 30 and is rotatably supported by a bearing 38 on the rotating support 20. With this configuration, the stage 34 is revolvable and rotatable. Each rotation shaft 36 extends to a position below the bearing 38, and a driven gear 40 is provided at the lower end of the rotation shaft 36. A cover 42 is provided below the bottom of the vacuum chamber 10 to seal components including the rotating support 20 from the atmosphere. The cover 42 includes an annular recessed part 44 and is formed by recessing a peripheral portion of a flat cylindrical body. Drive gears 46 are provided at four positions on the inner surface of the outer wall of the recessed part 44 and are arranged at regular intervals in plan view.

Each drive gear 46 is attached to an end of a horizontal rotation shaft 48 that passes through the outer wall of the recessed part 44 of the cover 42. A drive unit 50 is provided at the base end of the rotation shaft 48 to rotate the rotation shaft 48 and move the rotation shaft 48 in the axial direction. The side circumferential surface of the driven gear 40 is magnetized such that north and south poles are arranged alternately in the circumferential direction, and a surface of the drive gear 46 is magnetized such that north and south poles are arranged alternately in the circumferential direction. The driven gear 40 and the drive gear 46 are positioned such that a passage area where the driven gear 40 passes faces a portion of the surface of the drive gear 46 that is higher than the center of the surface of the drive gear 46.

The drive gear 46 is disposed in a position corresponding to a stop position of the rotary table 26. That is, the drive gear 46 is positioned such that a magnetic gear is formed between the drive gear 46 and the driven gear 40 when the substrate W is positioned at the center in the circumferential direction of each of four areas described later. The drive gear 46 is moved forward by the rotation shaft 48 to come close to the driven gear 40 and form a magnetic gear when the driven gear 40 stops at a position facing the drive gear 46. Then, when the drive gear 46 is rotated, for example, in a counterclockwise direction seen from the rotation shaft 48, the driven gear 40 rotates clockwise, and the stage 34 rotates. Also, a braking part 52 formed of, for example, a magnet is provided on the inner surface of the inner wall of the recessed part 44 of the cover 42 at a position facing the drive gear 46 across the passage area of the driven gear 40. When the drive gear 46 is retracted away from the driven gear 40 before rotating the rotary table 26, the braking part 52 stops the rotation of the driven gear 40.

Figure 2:
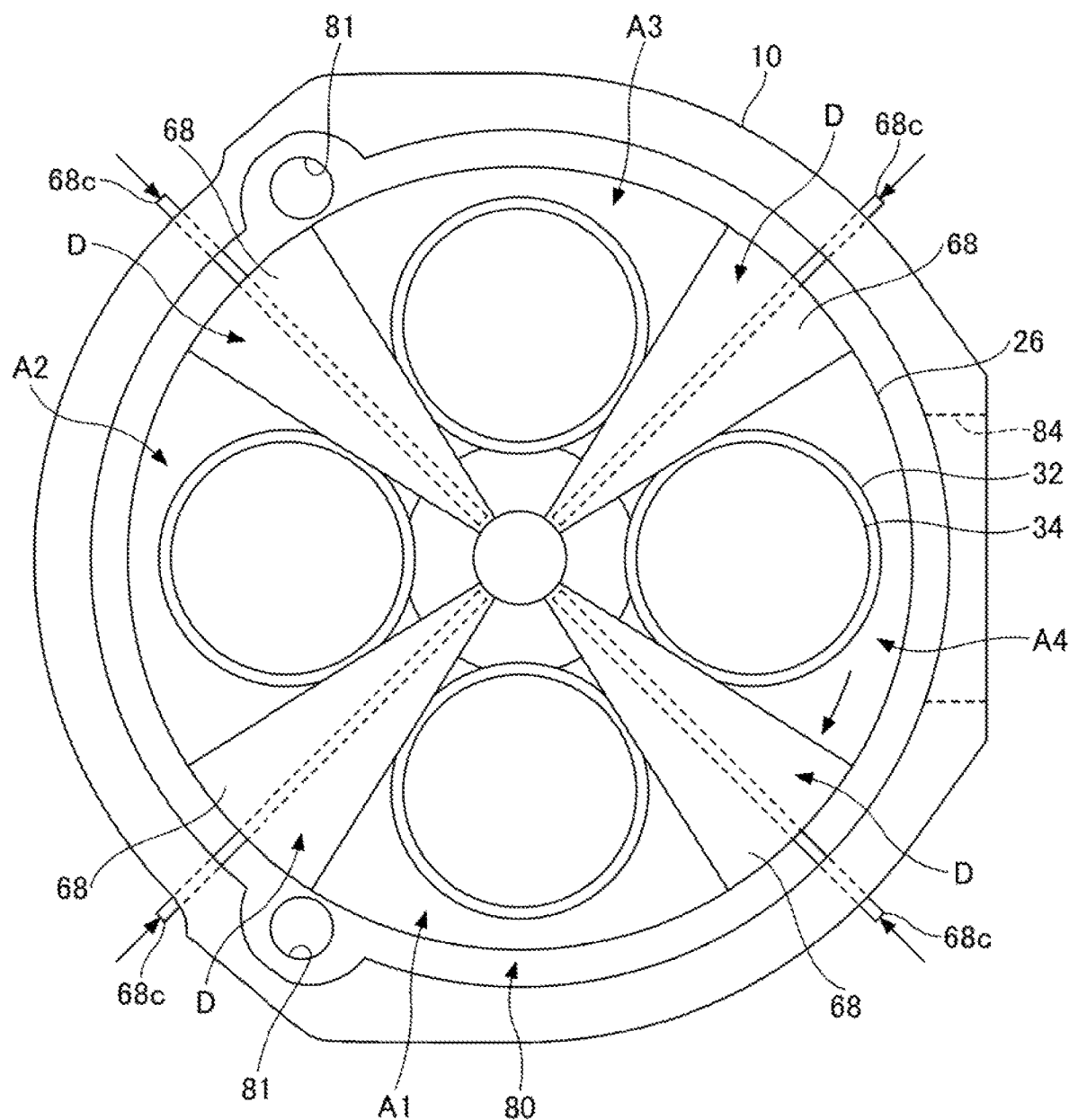
FIG. 2 is a drawing illustrating four areas of the film deposition apparatus according to the embodiment.
Figure 3:
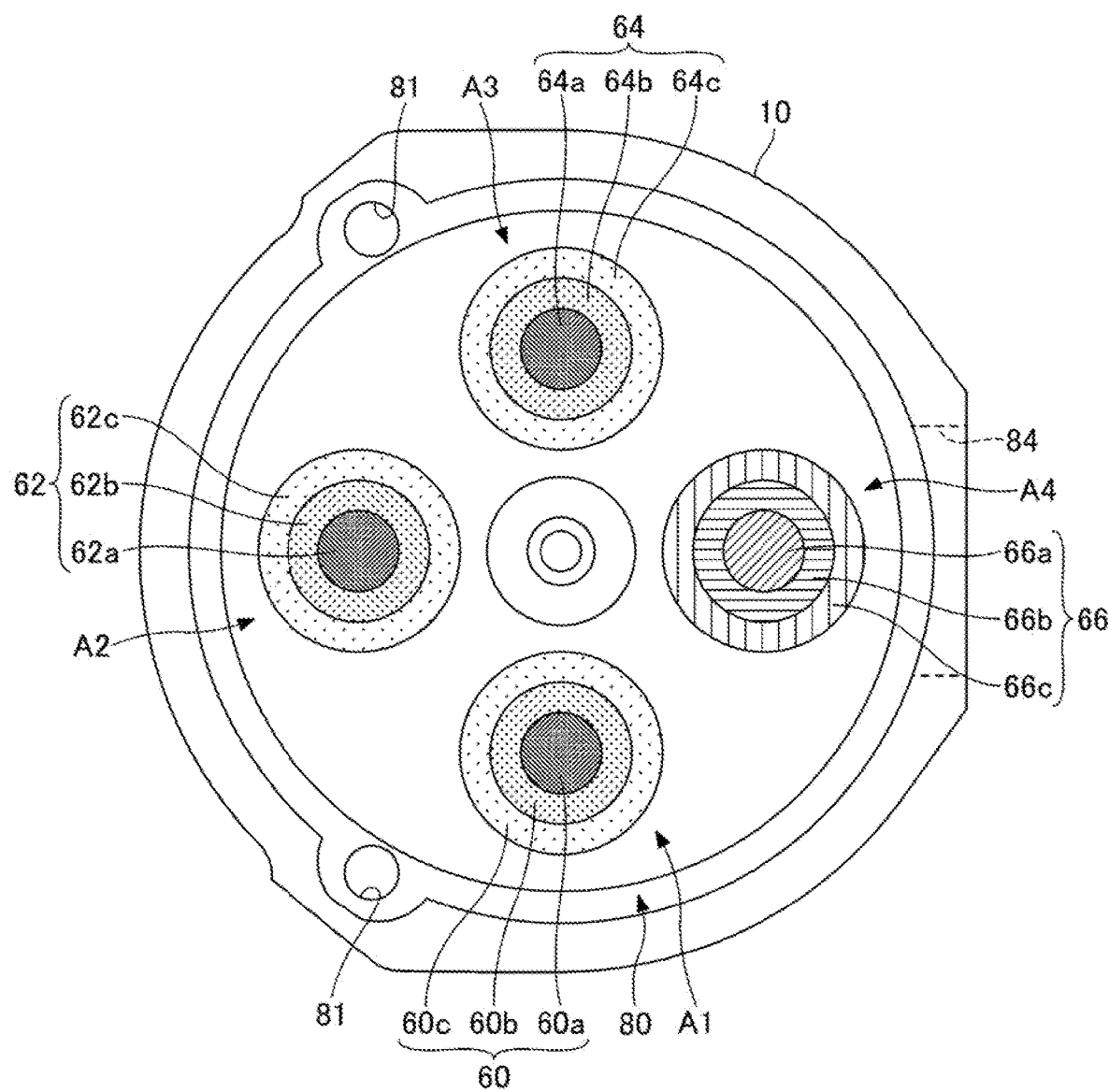
FIG. 3 is a drawing illustrating four areas of the film deposition apparatus according to the embodiment.
Figure 4:
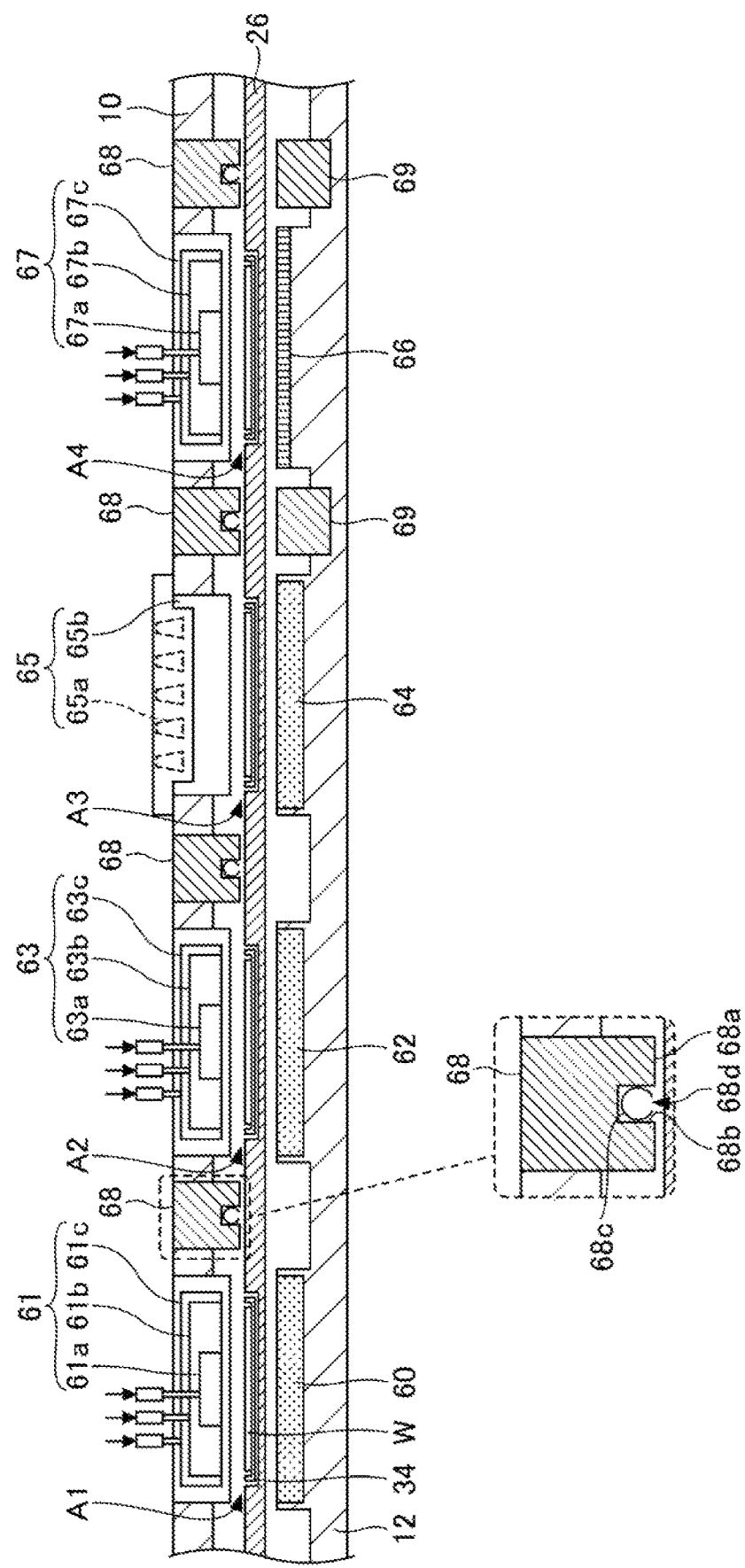
FIG. 4 is a vertical cross-sectional view taken along a circumferential direction of the film deposition apparatus according to the embodiment.
Figure 5:
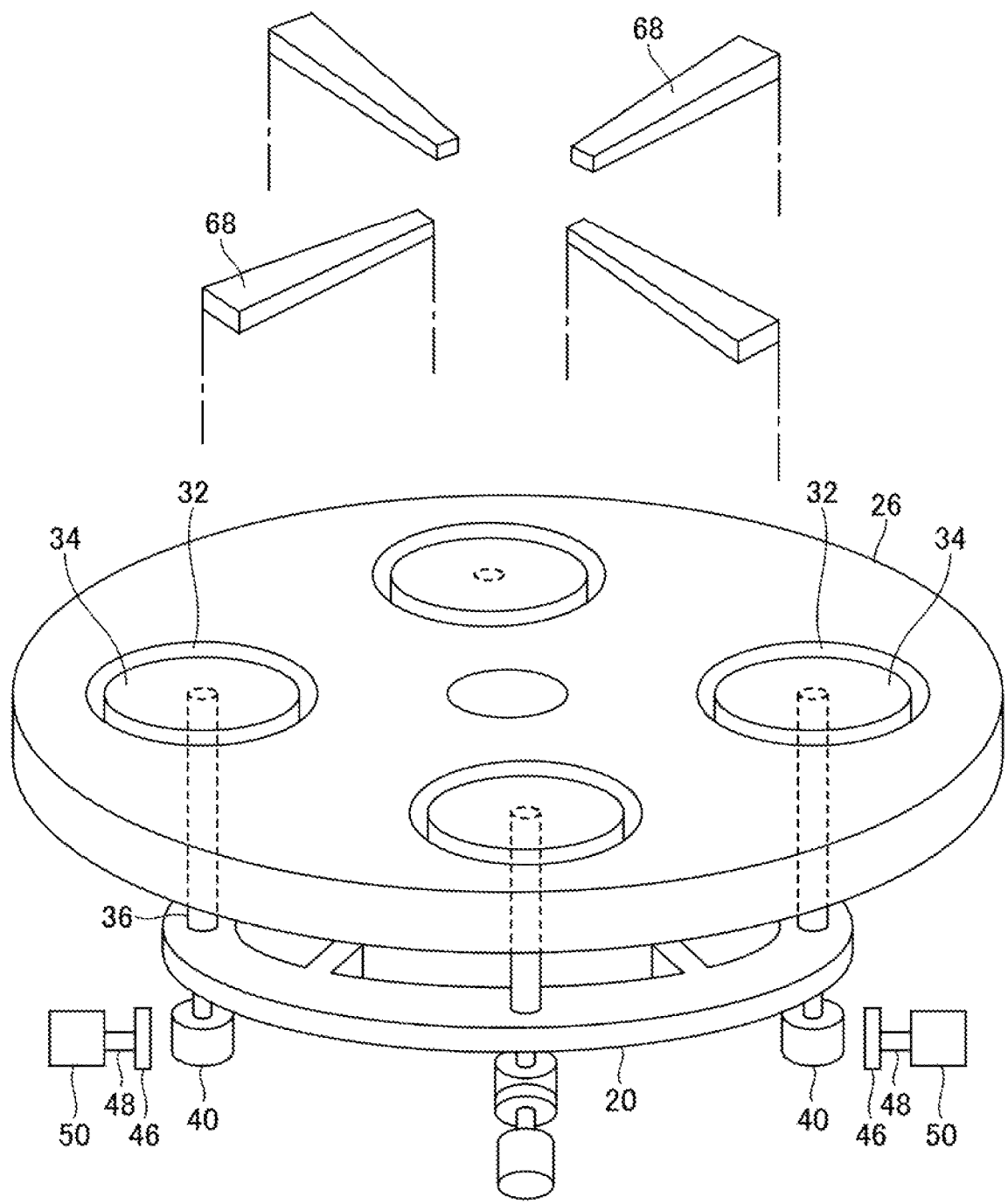
FIG. 5 is a drawing illustrating a rotation mechanism of the film deposition apparatus according to the embodiment.

FIGS. 2 and 3 are drawings for explaining four areas of the film deposition apparatus 1 of the present embodiment. FIG. 4 is a vertical cross-sectional view taken along the circumferential direction of the film deposition apparatus 1 of the present embodiment. FIG. 5 is a drawing illustrating a rotation mechanism of the film deposition apparatus 1 of the present embodiment.

As illustrated in FIG. 2, the vacuum chamber 10 includes an adsorption area A1, a reaction area A2, a heat treatment area A3, and a cooling area A4 that are arranged at intervals in the circumferential direction of the rotary table 26. In the example of FIG. 2, from an entry/exit port 84, the cooling area A4, the adsorption area A1, the reaction area A2, and the heat treatment area A3 are arranged clockwise (in the rotation direction of the rotary table 26) in this order. Separation areas D are provided between the adsorption area A1 and the reaction area A2, between the reaction area A2 and the heat treatment area A3, between the heat treatment area A3 and the cooling area A4, and between the cooling area A4 and the adsorption area A1.

In the adsorption area A1, a material gas is supplied toward the upper surface of the rotary table 26 and adsorbed onto the substrate W. For example, the material gas may be a silicon-containing gas such as a dichlorosilane (DCS) gas.

In the adsorption area A1, as illustrated in FIG. 3, a heater unit 60 is provided below the lower surface of the rotary table 26. The heater unit 60 heats the substrate W located in the adsorption area A1. The heater unit 60 includes an inner heater 60a, a middle heater 60b and an outer heater 60c. The inner heater 60a, the middle heater 60b, and the outer heater 60c are disposed to correspond to a central part, a middle part, and an outer part of the substrate W located in the adsorption area A1 and heat the central part, the middle part, and the outer part of the substrate W, respectively. This configuration makes it possible to control the distribution of temperature in the radial direction of the substrate W. However, the heater unit 60 is not necessarily divided into multiple parts.

Also, in the adsorption area A1, as illustrated in FIG. 4, a shower head 61, which is a material gas supply part, is provided above the upper surface of the rotary table 26. The shower head 61 includes, for example, an inner shower head 61a, a middle shower head 61b, and an outer shower head 61c. Each of the inner shower head 61a, the middle shower head 61b, and the outer shower head 61c are connected to a material gas source (not shown). The inner shower head 61a, the middle shower head 61b, and the outer shower head 61c are disposed to correspond to the central part, the middle part, and the outer part of the substrate W located in the adsorption area A1 and supply the material gas to the central part, the middle part, and the outer part of the substrate W, respectively. This configuration makes it possible to control the amount of supplied material gas in the radial direction of the substrate W and thereby makes it possible to adjust the amount of adsorbed material gas in the radial direction of the substrate W. However, the shower head 61 is not necessarily divided into multiple parts. Also, a gas nozzle may be provided instead of the shower head 61.

The reaction area A2 is disposed apart from the adsorption area A1 in the circumferential direction of the rotary table 26. In the reaction area A2, a reaction gas is supplied toward the upper surface of the rotary table 26 to cause the reaction gas to react with the material gas adsorbed on the substrate W. Examples of the reaction gas include an oxidation gas such as an ozone ($O_3$) gas and a nitride gas such as an ammonia ($NH_3$) gas.

In the reaction area A2, as illustrated in FIG. 3, a heater unit 62 is provided below the lower surface of the rotary table 26. The heater unit 62 heats the substrate W located in the reaction area A2. The heater unit 62 includes an inner heater 62a, a middle heater 62b and an outer heater 62c. The inner heater 62a, the middle heater 62b, and the outer heater 62c are disposed to correspond to the central part, the middle part, and the outer part of the substrate W located in the reaction area A2 and heat the central part, the middle part, and the outer part of the substrate W, respectively. This configuration makes it possible to control the distribution of temperature in the radial direction of the substrate W. However, the heater unit 62 is not necessarily divided into multiple parts.

Also, in the reaction area A2, as illustrated in FIG. 4, a shower head 63, which is a reaction gas supply part, is provided above the upper surface of the rotary table 26. The shower head 63 includes, for example, an inner shower head 63a, a middle shower head 63b, and an outer shower head 63c. Each of the inner shower head 63a, the middle shower head 63b, and the outer shower head 63c is connected to a reaction gas source (not shown). The inner shower head 63a, the middle shower head 63b, and the outer shower head 63c are disposed to correspond to the central part, the middle part, and the outer part of the substrate W located in the reaction area A2 and supply a reaction gas to the central part, the middle part, and the outer part of the substrate W, respectively. This configuration makes it possible to control the amount of supplied reaction gas in the radial direction of the substrate W. However, the shower head 63 is not necessarily divided into multiple parts. Also, a gas nozzle may be provided instead of the shower head 63.

The heat treatment area A3 is disposed apart from the reaction area A2 in the circumferential direction of the rotary table 26. In the heat treatment area A3, the substrate W is heat-treated at a temperature higher than the temperature in the adsorption area A1 and the reaction area A2.

In the heat treatment area A3, as illustrated in FIG. 3, a heater unit 64 is provided below the lower surface of the rotary table 26. The heater unit 64 heats the substrate W located in the heat treatment area A3. The heater unit 64 includes an inner heater 64a, a middle heater 64b, and an outer heater 64c. The inner heater 64a, the middle heater 64b, and the outer heater 64c are disposed to correspond to the central part, the middle part, and the outer part of the substrate W located in the heat treatment area A3 and heat the central part, the middle part, and the outer part of the substrate W, respectively. This configuration makes it possible to control the distribution of temperature in the radial direction of the substrate W. However, the heater unit 64 is not necessarily divided into multiple parts.

Also, in the heat treatment area A3, as illustrated in FIG. 4, a heating unit 65 is provided above the upper surface of the rotary table 26. The heating unit 65 includes multiple heating lamps 65a that are arranged in a substantially fan shape on the upper surface of a transmissive part 65b, and is controlled by a controller 90 such that an in-plane temperature difference is not generated on the substrate W. Each heating lamp 65a may be implemented by any type of lamp. For example, the heating lamp 65a may be implemented by a lamp that emits light in an absorption wavelength range of the substrate W such as infrared light. The transmissive part 65b may be formed of a material (e.g., quartz) that transmits light (e.g., infrared light).

The cooling area A4 is disposed apart from the heat treatment area A3 in the circumferential direction of the rotary table 26. In the cooling area A4, a cooling gas is supplied toward the upper surface of the rotary table 26 to cool the substrate W. Examples of the cooling gas include a helium (He) gas and a nitrogen ($N_2$) gas.

In the cooling area A4, as illustrated in FIG. 3, a cooling plate 66 is provided below the lower surface of the rotary table 26. The cooling plate 66 cools the substrate W located in the cooling area A4. The cooling plate 66 includes an inner plate 66a, a middle plate 66b, and an outer plate 66c. A refrigerant flow path is formed inside of each of the inner plate 66a, the middle plate 66b, and the outer plate 66c, and the substrate W is cooled by supplying a refrigerant from a chiller unit (not shown) into the refrigerant flow path. The inner plate 66a, the middle plate 66b, and the outer plate 66c are disposed to correspond to the central part, the middle part, and the outer part of the substrate W located in the cooling area A4 and cool the central part, the middle part, and the outer part of the substrate W, respectively. The cooling plate 66 is not necessarily divided into multiple parts.

Also, in the cooling area A4, as illustrated in FIG. 4, a shower head 67, which is a cooling gas supply part, is provided above the upper surface of the rotary table 26. The shower head 67 includes, for example, an inner shower head 67a, a middle shower head 67b, and an outer shower head 67c. Each of the inner shower head 67a, the middle shower head 67b, and the outer shower head 67c is connected to a cooling gas source (not shown). The inner shower head 67a, the middle shower head 67b, and the outer shower head 67c are disposed to correspond to the central part, the middle part, and the outer part of the substrate W located in the cooling area A4 and supply a cooling gas to the central part, the middle part, and the outer part of the substrate W, respectively. This configuration makes it possible to cool the substrate W. Also, this configuration makes it possible to control the amount of suppled cooling gas in the radial direction of the substrate W and thereby makes it possible to adjust the distribution of temperature in the radial direction of the substrate W. However, the shower head 67 is not necessarily divided into multiple parts. Further, a gas nozzle may be provided instead of the shower head 67.

The separation areas D are provided between the adsorption area A1 and the reaction area A2, between the reaction area A2 and the heat treatment area A3, between the heat treatment area A3 and the cooling area A4, and between the cooling area A4 and the adsorption area A1. As illustrated in FIGS. 2 and 5, for example, a separation plate 68 having a fan-like planar shape is provided in each separation area D. The width of the separation plate 68 gradually increases from the center toward the outer circumference of the vacuum chamber 10. As illustrated in FIG. 4, each of the separation plates 68 includes a ceiling surface 68a that is lower than the ceiling surfaces of the adsorption area A1, the reaction area A2, the heat treatment area A3, and the cooling area A4. With this configuration, the separation plates 68 separate gases between these four areas. A groove 68b is formed in the center in the width direction of the separation plate 68.

A separation gas nozzle 68c is disposed in the groove 68b. The separation gas nozzle 68c extends in the radial direction parallel to the rotary table 26 and passes through the side wall of the vacuum chamber 10. Multiple gas discharge holes 68d are formed in the lower surface of the separation gas nozzle 68c and arranged at intervals in the longitudinal direction. When seen in the radial direction of the rotary table 26, the gas discharge holes 68d are arranged such that a separation gas is supplied to the entire passage area of the substrate W. The base end of the separation gas nozzle 68c is connected to a separation gas supply system (not shown) including a separation gas supply source and gas supply control devices. The separation gas may be, for example, an inert gas such as an $N_2$ gas or an argon (Ar) gas.

In each of the separation areas D between the heat treatment area A3 and the cooling area A4 and between the cooling area A4 and the adsorption area A1, a separation plate 69 is provided below the lower surface of the rotary table 26. The separation plates 69 are walls extending from the bottom (the central part 12 and the annular part 14) of the vacuum chamber 10 toward the lower side of the rotary table 26, and suppress heat transfer between the heat treatment area A3 and the cooling area A4 and between the cooling area A4 and the adsorption area A1.

In the example of FIG. 4, the heating unit 65 including multiple heating lamps 65a and the transmissive part 65b is provided in the heat treatment area A3, and the substrate W is heated by the multiple heating lamps 65a. However, the present invention is not limited to this example. As another example, a plasma generator 70 that performs plasma-processing on the substrate W placed on the stage 34 to heat the substrate W may be provided in the heat treatment area A3.

Figure 6:
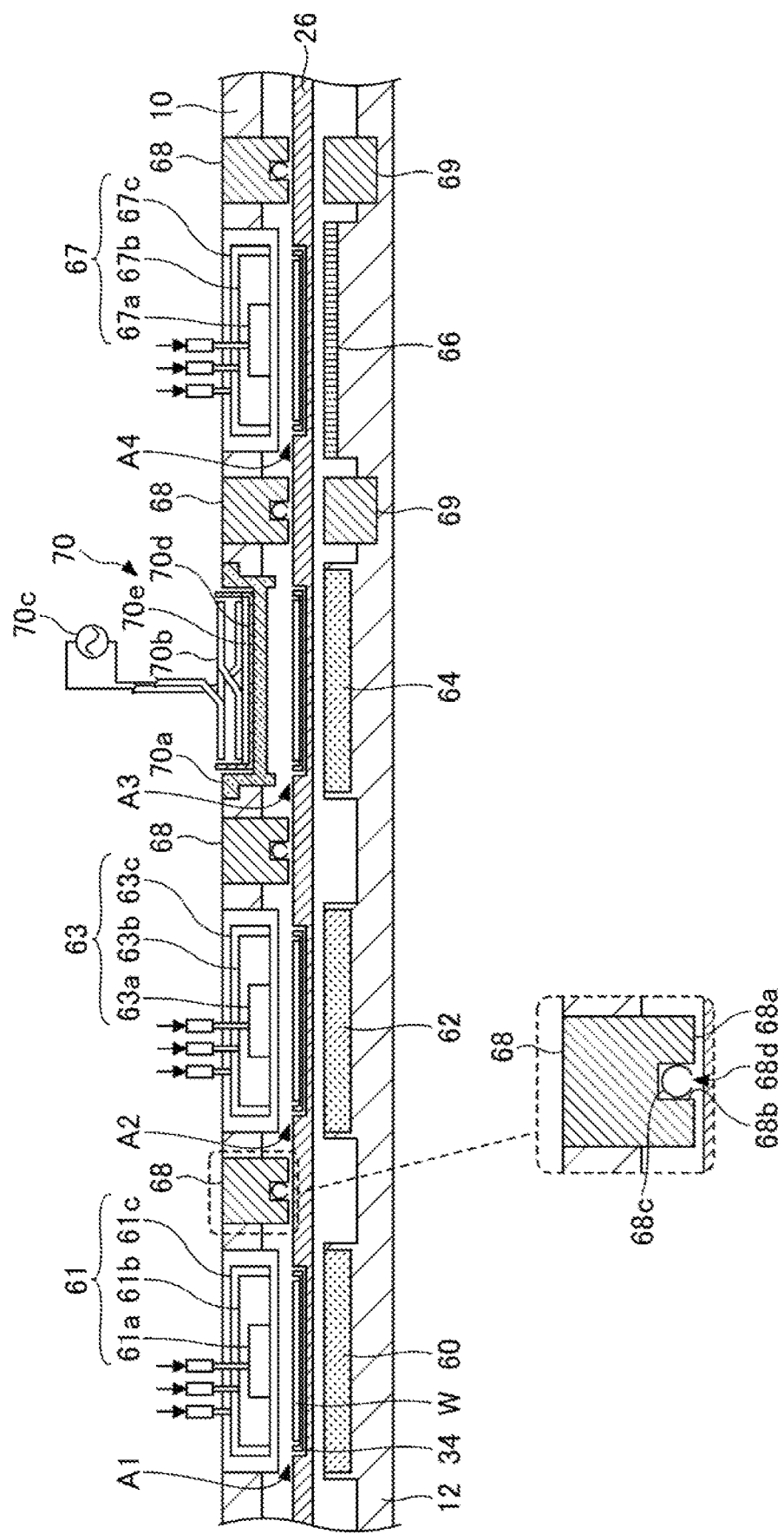
FIG. 6 is a drawing illustrating another example of a configuration of the film deposition apparatus according to the embodiment.

FIG. 6 is a drawing illustrating another example of a configuration of the film deposition apparatus 1 of the present embodiment. As illustrated in FIG. 6, the plasma generator 70 is disposed above the upper surface of the rotary table 26. The plasma generator 70 is provided via a dielectric part 70a that constitutes a part of the ceiling of the vacuum chamber 10. The dielectric part 70a has a fan-like planar shape that fits into an opening formed in the ceiling of the vacuum chamber 10. The peripheral portion of the dielectric part 70a rises and then bends outward to form a flange part.

The plasma generator 70 includes a coiled antenna 70b, and a high-frequency power supply 70c is connected to the ends of the antenna 70b. Also, a Faraday shield 70d is provided between the antenna 70b and the dielectric part 70a. The Faraday shield 70d is a conductive plate in which slits are formed to prevent an electric field component out of an electric field and a magnetic field generated by the antenna 70b from reaching the substrate W. A dielectric plate 70e is provided on the upper surface of the Faraday shield 70d.

At the periphery of the bottom of the vacuum chamber 10, a groove 80 for exhaust is formed to surround the rotary table 26. In the groove 80, exhaust ports 81 are formed at a position downstream of the adsorption area A1 and a position downstream of the reaction area A2 in the rotation direction of the rotary table 26. Each exhaust port 81 is connected to an end of an exhaust pipe 82 (see FIG. 1), and an exhaust device 83 such as a vacuum pump is connected to another end of the exhaust pipe 82.

The entry/exit port 84 (see FIGS. 2 and 3) for carrying in an out the substrate W is formed in the side wall of the vacuum chamber 10 at a position facing the cooling area A4. The substrate W is transferred between each stage 34 and an external transfer mechanism (not shown) via the entry/exit port 84. The entry/exit port 84 is opened and closed by a gate valve (not shown).

As illustrated in FIG. 1, the film deposition apparatus 1 includes a controller 90. The controller 90 includes a program for controlling the operations of the film deposition apparatus 1 described later. The program may also indicate a process recipe defining procedures and processing parameters. The program may be stored in a storage medium such as a hard disk, a compact disk, an optical disk, a USB memory, or a memory card, and downloaded to the controller 90.

<Operations of Film Deposition Apparatus>

Figure 7:
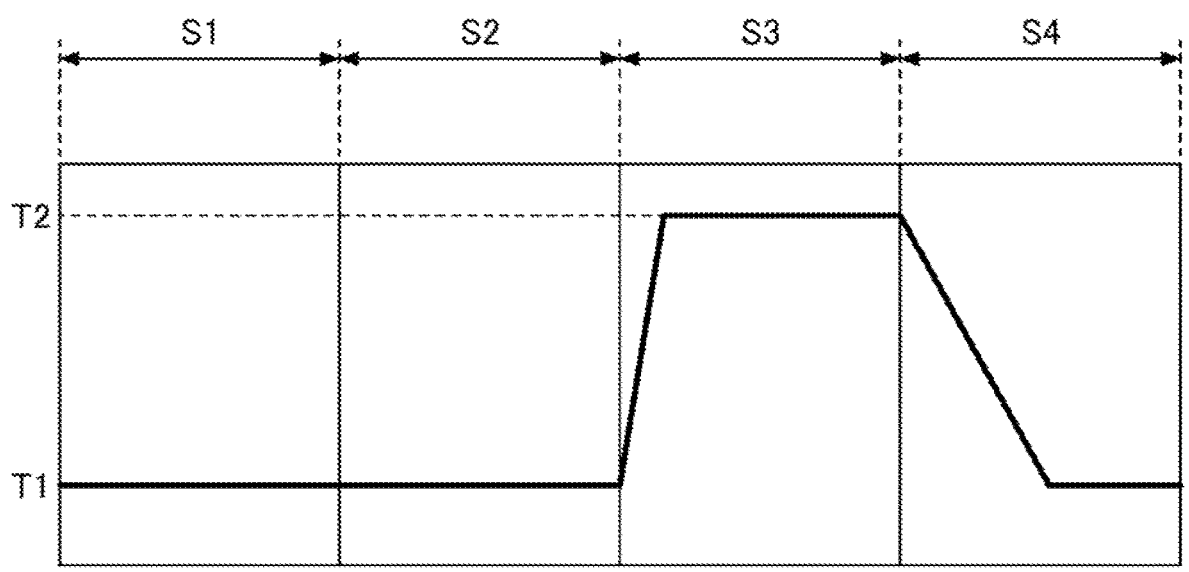
FIG. 7 is a drawing for explaining an example of operations of the film deposition apparatus according to the embodiment.

A process of forming a silicon oxide film on the substrate W is described with reference to FIG. 7 as an example of operations (a film deposition method) of the film deposition apparatus 1. FIG. 7 is a drawing for explaining an example of operations of the film deposition apparatus 1 according to the present embodiment.

First, the controller 90 controls a transfer mechanism (rot shown) in a vacuum transfer chamber adjacent to the vacuum chamber 10 to sequentially transfer four substrates W to the stages 34 via the entry/exit port 84. Each substrate W is transferred from and to the stage 34 via elevating pins (not shown). After one substrate W is transferred to a first stage 34, the rotary table 26 is rotated, for example, clockwise, and a subsequent substrate W is transferred to a second stage 34 adjacent to the first stage 34.

After placing the substrate W on each stage 34, the controller 90 causes the gate valve to close the entry/exit port 84, adjusts the pressure in the vacuum chamber 10 to a predetermined process pressure, and rotates the stage 34 relative to the rotary table 26 to rotate the substrate W. The inside of the vacuum chamber 10 is preheated to a first temperature T1 by the heaters 18. The first temperature T1 may be, for example, 300 to 500 degrees centigrade.

Next, the controller 90 controls the components of the film deposition apparatus 1 to perform an adsorption step S1, a reaction step S2, a heat treatment step S3, and a cooling step S4 in the adsorption area A1, the reaction area A2, the heat treatment area A3, and the cooling area A4, respectively.

In the adsorption area A1, the controller 90 causes the shower head 61 (FIG. 4) to discharge a DCS gas that is a material gas. As a result, the DCS gas is adsorbed on the surface of the substrate W located in the adsorption area A1. Here, because the substrate W is rotated by the magnetic gear, the DCS gas is adsorbed on the substrate W with good uniformity in the circumferential direction.

In the reaction area A2, the controller 90 causes the shower head 63 (FIG. 4) to discharge an $O_3$ gas that is a reaction gas. Here, although the $O_3$ gas is supplied to the surface of the substrate W located in the reaction area A2, because the DCS gas has not been adsorbed at this stage, no reaction product is generated. Therefore, the reaction gas may be supplied in the reaction area A2 after the next rotation (intermittent rotation) of the rotary table 26, i.e., after the substrate W on which the DCS gas has already been adsorbed is positioned in the reaction area A2.

In the heat treatment area A3, the controller 90 turns on the heating lamps 65a of the heating unit 65 to heat the substrate W to a second temperature T2 higher than the first temperature T1 as illustrated in FIG. 7. The second temperature T2 may be, for example, 600 to 900 degrees centigrade. Here, although the substrate W located in the heat treatment area A3 is heated by the heating lamps 65a, because no reaction product has been generated at this stage, modification of the reaction product is not performed. Therefore, heating by the heating lamps 65a in the heat treatment area A3 may be performed after the substrate W on which a reaction product has already been generated is positioned in the heat treatment area A3.

In the cooling area A4, the controller 90 causes the shower head 67 (FIG. 4) to discharge an He gas that is a cooling gas. As a result, the He gas is supplied to the surface of the substrate W located in the cooling area A4, and the substrate W is cooled. In the cooling area A4, the cooling plate 66 is provided below the lower surface of the rotary table 26. With this configuration, because the substrate W located in the cooling area A4 is cooled from both of the upper surface and the lower surface of the substrate W, the temperature of the substrate W rapidly drops from the second temperature T2 to the first temperature T1.

Also, the controller 90 causes the separation gas nozzles 68c to discharge an $N_2$ gas, which is a separation gas, in the four separation areas D. This prevents gases from adjacent areas from mixing with each other. That is, the atmospheres in the areas are separated from each other.

After a predetermined period of time, the controller 90 rotates the rotary table 26 clockwise by 90 degrees and thereby moves each substrate W (or causes each substrate W to revolve) to an area that is adjacent to the previously-located area (specifically, an area that is adjacent to the previously-located area in the rotation direction of the rotary table 26). Then, the controller 90 performs a process in each of the adsorption area A1, the reaction area A2, the heat treatment area A3, and the cooling area A4 while rotating the substrate W. Because the DCS gas, which is a material gas, has already been adsorbed on the substrate W located in the reaction area A2, the $O_3$ gas, which is a reaction gas, reacts with the DCS gas on the substrate W, and a silicon oxide layer is formed as a reaction product. In the adsorption area A1, the DCS gas is discharged from the shower head 61, and the DCS gas is adsorbed on the substrate W located in the adsorption area A1.

After a predetermined period of time, the controller 90 rotates the rotary table 26 clockwise by 90 degrees and thereby moves each substrate W to an area adjacent to the previously-located area. Then, the controller 90 performs a process in each of the adsorption area A1, the reaction area A2, the heat treatment area A3, and the cooling area A4 while rotating the substrate W. In the adsorption area A1, the DCS gas is adsorbed on the substrate W; in the reaction area A2, the DCS gas on the substrate W is oxidized by the $O_3$ gas; in the heat treatment area A3, the reaction product on the substrate W is modified; and in the cooling area A4, the substrate W is cooled.

After a predetermined period of time, the controller 90 rotates the rotary table 26 clockwise by 90 degrees and thereby moves each substrate W to an area adjacent to the previously-located area. Then, the controller 90 performs a process in each of the adsorption area A1, the reaction area A2, the heat treatment area A3, and the cooling area A4 while rotating the substrate W. In the adsorption area A1, the DCS gas is adsorbed on the substrate W; in the reaction area A2, the DCS gas on the substrate W is oxidized by the $O_3$ gas; in the heat treatment area A3, the reaction product on the substrate W is modified; and in the cooling area A4, the substrate W is cooled.

Then, after a predetermined period of time, the controller 90 rotates the rotary table 26 clockwise by 90 degrees. As a result, the substrates W return to their initial positions.

Thereafter, in a similar manner, the controller 90 repeats, a set number of times, the process of sequentially stopping the rotary table 26 for a predetermined period of time and intermittently rotating the rotary table 26 clockwise by 90 degrees. As a result, a silicon oxide film is formed on each substrate W by atomic layer deposition (ALD).

Next, the controller 90 causes the transfer mechanism to carry the substrates W out of the vacuum chamber 10 through a procedure reverse to the above-described procedure for carrying in the substrates W.

As described above, the film deposition apparatus 1 of the present embodiment includes the adsorption area A1, the reaction area A2, the heat treatment area A3, and the cooling area A4 in the same vacuum chamber 10. This configuration makes it possible to perform processes with different processing temperatures in the same vacuum chamber 10. For example, the adsorption step S1 and the heat treatment step S3 in an ALD process can be performed at different temperatures. This makes it possible to perform the adsorption step S1 at a temperature at which the material gas does not self-decompose and cause a chemical vapor deposition (CVD) reaction, and perform the heat treatment step S3 at a temperature higher than that in the adsorption step S1. This in turn makes it possible to form a film having good quality and good step coverage for the base layer. For example, a film with good quality can be conformally formed on a trench with a high aspect ratio or a trench with a complex shape.

Also, the above configuration makes it possible to perform the heat treatment step S3 and the cooling step S4 following the ALD cycle including the adsorption step S1 and the reaction step S2 without carrying the substrate W out of the vacuum chamber 10. This makes it possible to eliminate time for transferring the substrate W between an apparatus for performing the ALD cycle including the adsorption step S1 and the reaction step S2 and an apparatus for performing the heat treatment step S3, and thereby makes it possible to improve the productivity. Also, the above configuration makes it possible to perform the heat treatment step S3 each time the ALD cycle is performed once, or to perform the heat treatment step S3 each time the ALD cycle is performed a predetermined number of times.

The film deposition apparatus 1 of the present embodiment is configured such that the stage 34 is rotatable relative to the rotary table 26. This configuration makes it possible to perform a process in each of the adsorption area A1, the reaction area A2, the heat treatment area A3, and the cooling area A4 while rotating the stage 34 relative to the rotary table 26 (while rotating the substrate W). This in turn makes it possible to form a film having a uniform thickness and uniform quality in the circumferential direction of the substrate W.

<Variation of Film Deposition Apparatus>

Figure 8:
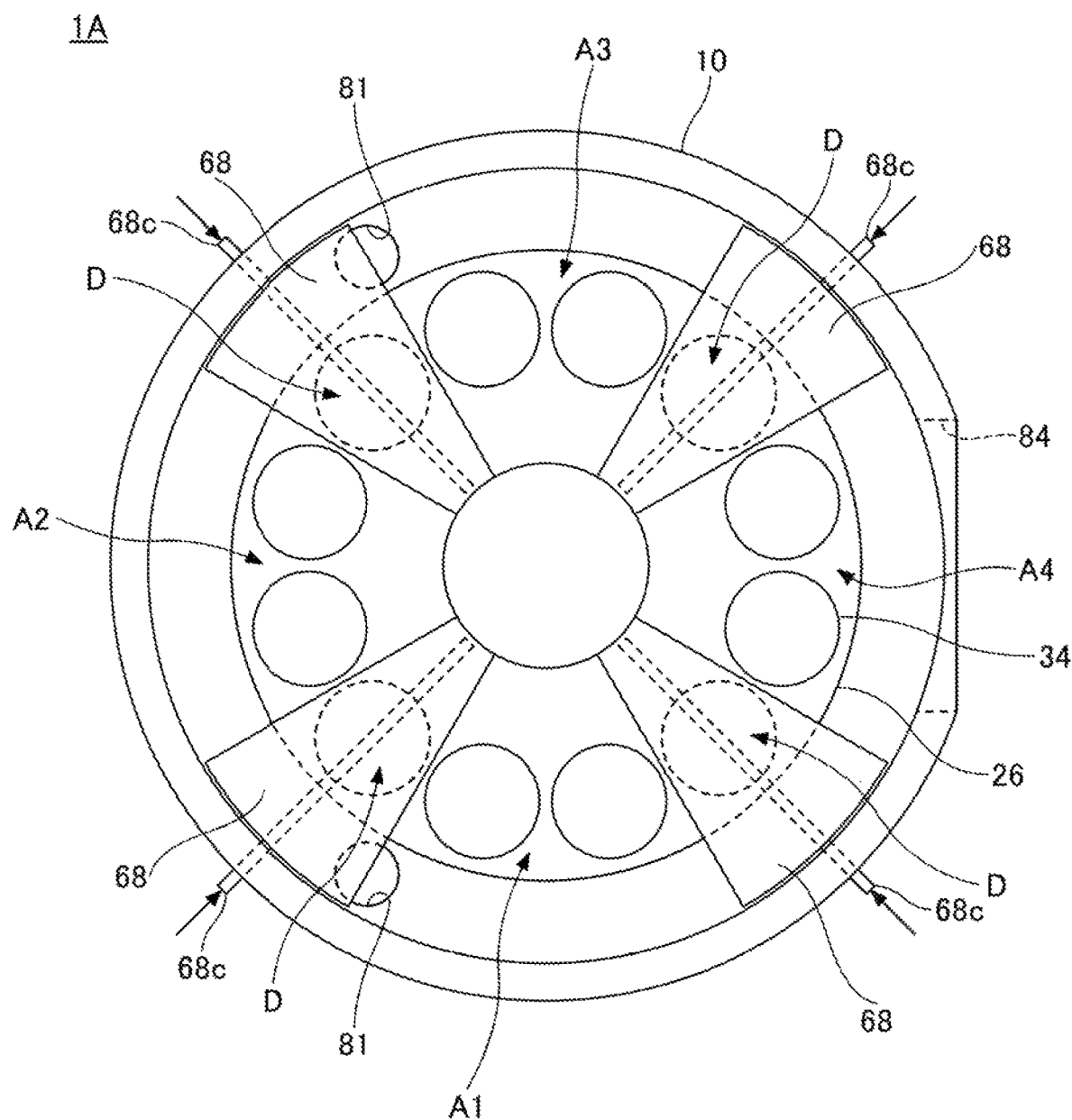
FIG. 8 is a drawing illustrating an example of a configuration of a film deposition apparatus according to a variation.

A variation of the film deposition apparatus 1 is described with reference to FIG. 8. FIG. 8 is a drawing illustrating an example of a configuration of a film deposition apparatus 1A that is a variation of the film deposition apparatus 1.

The film deposition apparatus 1A is different from the film deposition apparatus 1 in that stages 34 are arranged such that two substrates W can be placed in each of the adsorption area A1, the reaction area A2, the heat treatment area A3, and the cooling area A4.

Similarly to the film deposition apparatus 1, the film deposition apparatus 1A includes the adsorption area A1, the reaction area A2, the heat treatment area A3, and the cooling area A4 in the same vacuum chamber 10. This configuration makes it possible to perform processes with different processing temperatures in the same vacuum chamber 10. For example, the adsorption step S1 and the heat treatment step S3 in an ALD process can be performed at different temperatures. This makes it possible to perform the adsorption step S1 at a temperature at which the material gas does not self-decompose and cause a CVD reaction, and perform the heat treatment step S3 at a temperature higher than that in the adsorption step S1. This in turn makes it possible to form a film having good quality and good step coverage for the base layer. For example, a film with good quality can be conformally formed on a trench with a high aspect ratio or a trench with a complex shape.

Also, the above configuration makes it possible to perform the heat treatment step S3 and the cooling step S4 following the ALD cycle including the adsorption step S1 and the reaction step S2 without carrying the substrate W out of the vacuum chamber 10. This makes it possible to eliminate time for transferring the substrate W between an apparatus for performing the ALD cycle including the adsorption step S1 and the reaction step S2 and an apparatus for performing the heat treatment step S3, and thereby makes it possible to improve the productivity. Also, this configuration makes it possible to perform the heat treatment step S3 each time the ALD cycle is performed once, or to perform the heat treatment step S3 each time the ALD cycle is performed a predetermined number of times.

The film deposition apparatus 1A of the variation is configured such that the stage 34 is rotatable relative to the rotary table 26. This configuration makes it possible to perform a process in each of the adsorption area A1, the reaction area A2, the heat treatment area A3, and the cooling area A4 while rotating the stages 34 relative to the rotary table 26 (while rotating the substrates W). This in turn makes it possible to form a film having a uniform thickness and uniform quality in the circumferential direction of the substrate W.

Further, the film deposition apparatus 1A of the variation can simultaneously process two substrates W in each area and can therefore improve productivity.

A film deposition apparatus and a film deposition method according to embodiments of the present invention are described above. However, the present invention is not limited to the specifically disclosed embodiments, and variations and modifications may be made without departing from the scope of the present invention.

In the above embodiment, four areas are provided in the vacuum chamber 10. However, the present invention is not limited to this example. As another example, when a film (e.g., a silicon film) that does not require an oxidation process or a nitridation process is to be formed, three areas may be provided in the vacuum chamber 10. In this case, the three areas may be a process area, the heat treatment area A3, and the cooling area A4. In the process area, a process gas such as a silicon-containing gas is supplied.

In the above embodiment, a magnetic gear is used as an example of a rotation mechanism for rotating the stage 34 relative to the rotary table 26. However, the present invention is not limited to this example. As another example, a motor may be used instead of the magnetic gear.

In the above embodiment, a process of forming a silicon oxide film on the substrate W is used as an example to describe the operations of the film deposition apparatus 1. However, the present invention is not limited to this example. As another example, the film deposition apparatus 1 of this disclosure may also be applied to a process for forming a film such as a silicon nitride film, a metal oxide film, or a metal nitride film on the substrate W.

What is claimed is:

1. A film deposition apparatus, comprising:
   a rotary table disposed in a vacuum chamber;
   multiple stages on each of which a substrate is placeable, the stages being arranged along a circumferential direction of the rotary table;
   a process area configured to supply a process gas toward an upper surface of the rotary table;
   a heat treatment area that is disposed apart from the process area in the circumferential direction of the rotary table and configured to heat-treat the substrate at a temperature higher than a temperature used in the process area;
   a cooling area that is disposed apart from the heat treatment area in the circumferential direction of the rotary table and configured to cool the substrate,
   a first cooler disposed in the cooling area above the upper surface of the rotary table; and
   a second cooler disposed in the cooling area below a lower surface of the rotary table,
   wherein the first cooler includes an inner shower head, a middle shower head, and an outer shower head that are disposed to respectively correspond to a central part, a middle part, and an outer part of the substrate located in the cooling area, the central part being formed in a circle shape, and each of the middle part and the outer part being formed in an annular shape,
   wherein the second cooler includes an inner plate, a middle plate, and an outer plate that are disposed to respectively correspond to the central part, the middle part, and the outer part of the substrate located in the cooling area,
   wherein the second cooler is provided below the stages and provided spaced apart from the stages, the second cooler being fixed to the vacuum chamber, and
   wherein a physical space is present between an entirety of the second cooler and the stages.

2. The film deposition apparatus as claimed in claim 1, further comprising:
   separation areas disposed between the process area and the heat treatment area, between the heat treatment area and the cooling area, and between the cooling area and the process area.

3. The film deposition apparatus as claimed in claim 1, wherein the process area includes
   an adsorption area configured to supply a material gas toward the upper surface of the rotary table to cause the material gas to be adsorbed on the substrate, and
   a reaction area that is disposed apart from the adsorption area in the circumferential direction of the rotary table and configured to supply a reaction gas toward the upper surface of the rotary table to cause the reaction gas to react with the material gas adsorbed on the substrate.

4. The film deposition apparatus as claimed in claim 3, further comprising:
   a separation area disposed between the adsorption area and the reaction area.

5. The film deposition apparatus as claimed in claim 1, further comprising:
   a rotation mechanism configured to rotate each of the stages relative to the rotary table.

6. The film deposition apparatus as claimed in claim 1, further comprising:
   a heating unit disposed in the heat treatment area above the upper surface of the rotary table and configured to heat the substrate placed on one of the stages that is located in the heat treatment area.

7. The film deposition apparatus as claimed in claim 1, further comprising:
   a plasma generator disposed in the heat treatment area and configured to perform plasma processing on the substrate placed on one of the stages that is located in the heat treatment area.

8. The film deposition apparatus as claimed in claim 1, wherein the first cooler is a cooling gas supply part configured to supply a cooling gas to the substrate placed on one of the stages that is located in the cooling area.

9. The film deposition apparatus as claimed in claim 1, wherein the second cooler is a cooling plate configured to cool the substrate placed on one of the stages that is located in the cooling area.

10. The film deposition apparatus as claimed in claim 1, further comprising:
    a controller configured to intermittently rotate the rotary table such that the substrate passes through the process area, the heat treatment area, and the cooling area in this order.

11. A film deposition method, comprising:
    placing a substrate on each of stages arranged along a rotation direction of a rotary table provided in a vacuum chamber; and
    intermittently rotating the rotary table and thereby repeating a cycle multiple times, the cycle including
    supplying a process gas toward an upper surface of the substrate,
    heat-treating the substrate onto which the process gas is supplied at a temperature higher than a temperature used in the supplying of the process gas, and
    cooling the heat-treated substrate by using a first cooler disposed above the upper surface of the rotary table and a second cooler disposed below a lower surface of the rotary table,
    wherein the first cooler includes an inner shower head, a middle shower head, and an outer shower head that are disposed to respectively correspond to a central part, a middle part, and an outer part of the substrate,
wherein the second cooler includes an inner plate, a middle plate, and an outer plate that are disposed to respectively correspond to the central part, the middle part, and the outer part of the substrate,
wherein the second cooler is provided below the stages and provided spaced apart from the stages, the second cooler being fixed to the vacuum chamber, and
wherein a physical space is present between an entirety of the second cooler and the stages.

* * * * *